United States Patent [19]

Livermore

[11] 4,112,357
[45] Sep. 5, 1978

[54] LIGHTING CURRENT DETECTOR

[75] Inventor: Stephen F. Livermore, Satellite Beach, Fla.

[73] Assignee: The United States of America as represented by the Administrator of the National Aeronautics and Space Administration, Washington, D.C.

[21] Appl. No.: 835,544

[22] Filed: Sep. 22, 1977

[51] Int. Cl.² ............................................. G01R 31/02
[52] U.S. Cl. ..................................... 324/72; 324/102; 324/112; 324/113; 324/133
[58] Field of Search ............... 324/102, 112, 113, 133, 324/72; 340/253 P

[56] References Cited

U.S. PATENT DOCUMENTS 2,870,407  1/1959  Baker ................................... 324/102

Primary Examiner—M. Tokar
Attorney, Agent, or Firm—James O. Harrell; John R. Manning

[57] ABSTRACT

An apparatus for measuring the intensity of current produced in an elongated electrical conductive member by a lightning strike for determining the intensity of the lightning strike. The apparatus includes an elongated strip of magnetic material that is carried within an elongated tubular housing. A predetermined electrical signal is recorded along the length of said elongated strip of magnetic material. One end of the magnetic material is positioned closely adjacent the electrically conductive member so that the magnetic field produced by current flowing through said electrically conductive member disturbs a portion of the recorded electrical signal directly proportional to the intensity of the lightning strike.

7 Claims, 4 Drawing Figures

U.S. Patent      Sept. 5, 1978      4,112,357
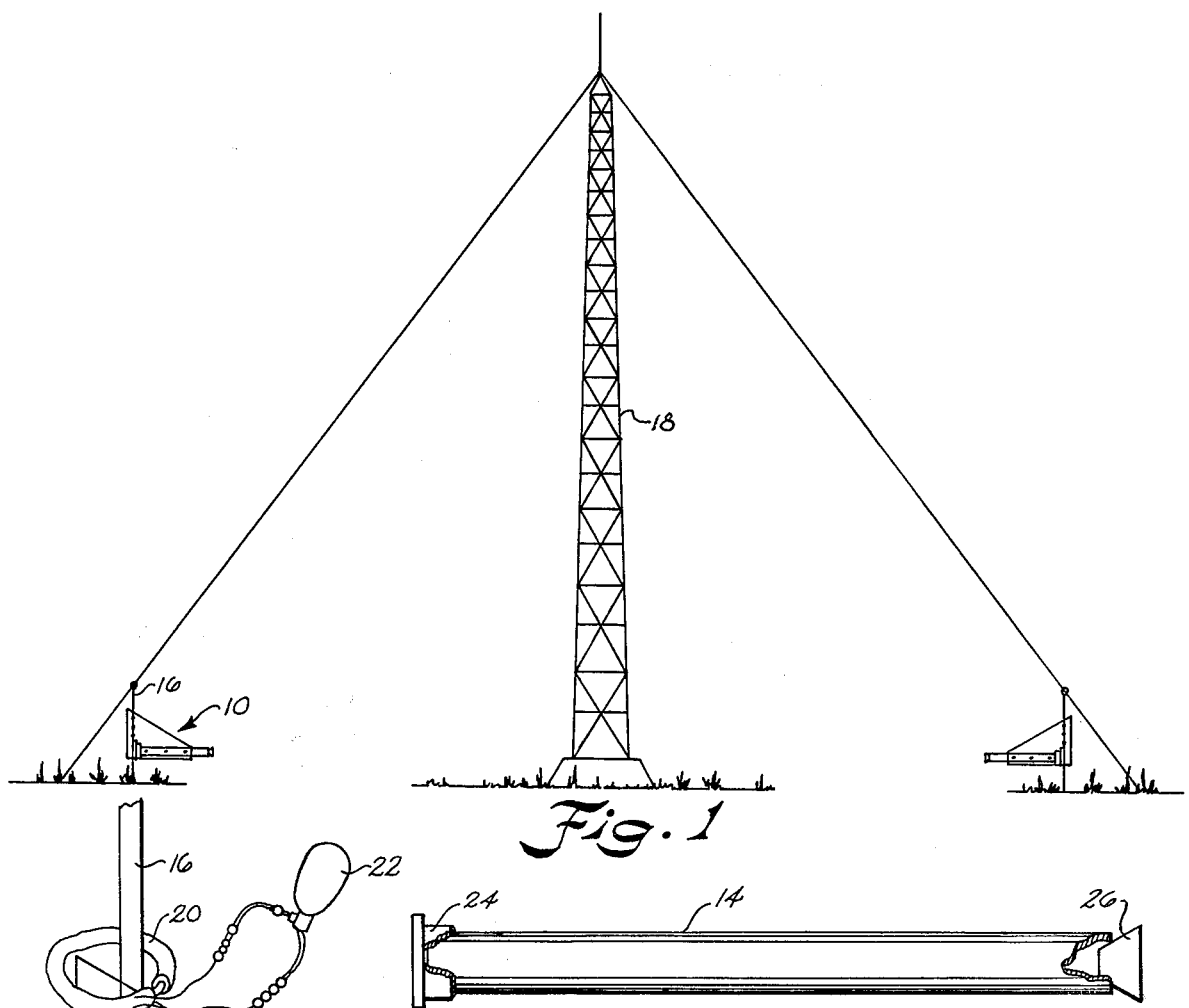
Fig. 1
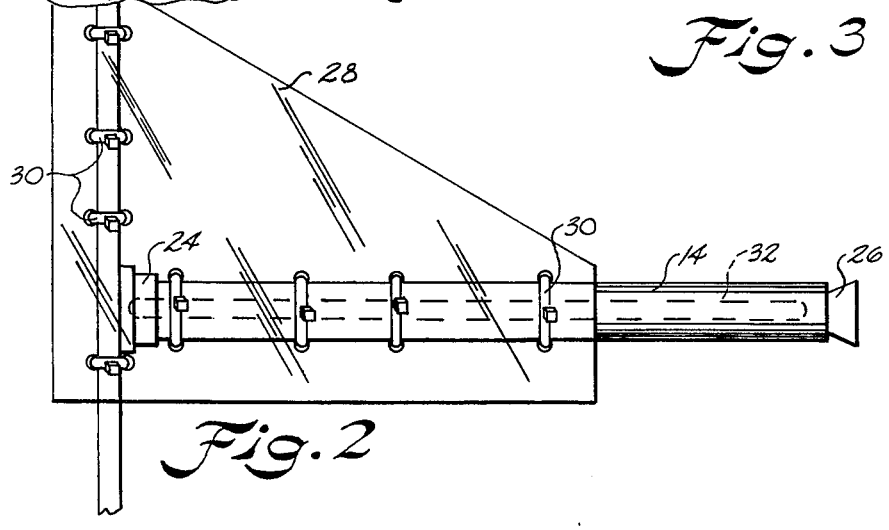
Fig. 2
Fig. 3
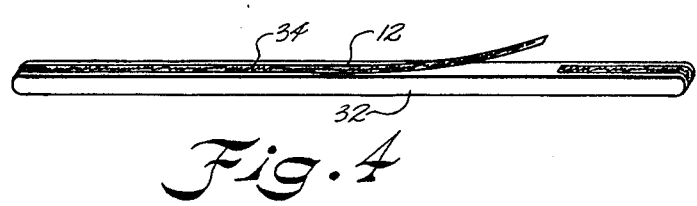
Fig. 4

LIGHTING CURRENT DETECTOR

ORIGIN OF THE INVENTION

The invention described herein was made by an employee of the United States Government and may be manufactured and used by or for the Government or for governmental purposes without the payment of any royalties thereon or therefor.

BACKGROUND OF THE INVENTION

The present invention relates to a device for monitoring electrical strikes and, more particularly, to a device which will produce a disturbed magnetic signal directly proportional to the maximum intensity of the lightning strike.

Heretofore, magnetic links were used in monitoring the intensity of lightning strikes and for recording the maximum current amplitudes produced thereby in electrically conductive members. The magnetic links are relatively small links of cobalt steel having a high magnetic retentivity that are magnetically polarized when current passes close thereto. These links are then taken to a laboratory and the degree of magnetization is measured for determining the maximum current that passes thereby.

One of the problems encountered in utilizing such magnetic links is that when two or more strokes of lightning of reverse polarities struck the tower, the residual magnetism produced in the magnetic links would effectively cancel out and indicate a current reading close to zero.

Another problem encountered in utilizing such magnetic links is that high currents from strong lightning strikes would often saturate the magnetic links and provide an inaccurate measurement of the true maximum current.

Another disadvantage in using the magnetic links is that they must be removed and taken to a laboratory for analysis in order to determine the maximum current produced by the lightning strikes.

In U.S. Pat. No. 3,889,185 entitled "Lightning Current Measuring System," there is disclosed a system for monitoring and analyzing electrical currents produced by lightning strikes. This apparatus includes an electrically conductive mass having a first circuit coupled thereto for generating a D.C. voltage proportion to a peak current generated in the mast by each lightning strike. A second circuit is coupled to the mast for generating a digital signal representative of the wave shape of the current generated in the mast by each lightning strike and a third circuit is provided closely adjacent the mast for producing a reference voltage. Signals are fed into a strip chart recorder making a permanent record of the current produced by the lightning strike. Loop antennae are often utilized for determining the distance to a lightning strike from a particular station, and an example of such a device is disclosed in U.S. Pat. No. 3,715,660.

SUMMARY OF THE INVENTION

The invention includes an apparatus for measuring the intensity of the current produced in an elongated electically conductive member by a lightning strike. By measuring the current flowing through an electrically conductive member, the maximum intensity of the lightning strike can be determined. The apparatus includes an elongated strip of magnetic material that is carried within a tubular housing. The tubular housing is mounted perpendicular to the electrically conductive member. The elongated strip of magnetic material has a predetermined electrical signal recorded along the length thereof. One end of the magnetic material is positioned closely adjacent the electrically conductive member so that the magnetic field produced by the current flowing through the electrically conductive member disturbs this prerecorded electrical signal a distance from the mast directly proportional to the intensity of the lightning strike.

By analyzing the disturbance of the predetermined, recorded electrical signal and comparing this disturbance with known charts, the intensity of the lightning strike can be determined.

Accordingly, it is an object of the present invention to provide a simple and inexpensive device for monitoring the maximum intensity of lightning strikes.

Another important object of the present invention is to provide an apparatus for measuring the intensity of lightning strikes which is relatively safe in operation and requires inexpensive components.

Still another important object of the present invention is to provide an apparatus for measuring the maximum intensity of lightning strikes which utilizes equipment which is not normally damaged by the high currents and voltages generated by the lightning strike.

These and other objects and advantages of the invention will become apparent upon reference to the following specification, attendant claims, and drawings.

BRIEF DESCRIPTION OF THE DRAWING

FIG. 1 is a perspective view illustrating a tower having guide wires extending downwardly from the top on which a lightning monitoring apparatus constructed in accordance with the present invention is attached.

FIG. 2 is an enlarged elevational view illustrating a lightning current detector constructed in accordance with the present invention.

FIG. 3 is a plane view illustrating a tube forming part of the lightning current detector.

FIG. 4 is a perspective view illustrating a magnetic recording strip mounted on a plexiglass strip that is carried within the tube as illustrated in FIG. 3.

DESCRIPTION OF THE PREFERRED EMBODIMENT

The lightning current detector as shown in FIGS. 1 and 2 and generally referred to by the reference character 10 is a passive device which consists of a strip of magnetic tape 12 with a pre-recorded signal mounted in a weather protective tube 14 perpendicular to a ground conductor 16 of a tower 18. The lightning current detector is mounted to the outer guide wire ground cable 16 for recording the peak value of the lightning currents flowing through these paths. A current sensing coil 20 which has a flashbulb 22 is also mounted on the ground cable 16 for producing a visual indication of a lightning strike to the tower. The voltage induced in the coil 20 by a lightning strike causes the flashbulb 22 to be energized. Upon observing the flashbulb 22 flashing or observing that it had previously flashed by burning out, an indication is produced that lightning has caused a current to flow through the guide wire 16.

The lightning current detector includes a tubular housing 14 which has a plastic cap 24 secured to an inner end thereof. A rubber stopper 26 is inserted in the other end of the tubular member 14 for providing a sealed tubular housing. A plexiglass brace 28 is used for connecting the tubular housing 14 to the ground cable 16. Normally, non-conductive connectors 30 are used for securing the tubular member 14 to the plexiglass brace and for securing the plexiglass plate to the ground cable 16. The tubular member 14 is mounted perpendicular to the ground cable 16 with the plastic cap 24 being flush against the cable 16.

Carried within the tubular member 14 is an elongated strip of magnetic material 12 that is in the form of an endless belt. An electrical signal indicated by the line 34 is recorded along the length of the belt 12 on opposite sides thereof. In one particular application, an 8 khz reference signal was recorded on the magnetic tape 12. This reference signal, as illustrated in FIG. 4, is recorded along the length of the magnetic tape 12. A plexiglass member 32 is inserted within the tubular housing 14 for holding the magnetic tape 12 in an extended position. The plexiglass member with the magnetic belt 12 positioned thereon is positioned within the tubular member 14 with the inner end thereof flush against the cap 24.

The principal of operation of the current detector is that when lightning current travels down a current carrying conductor such as the ground conductor 16, a magnetic field is produced which will erase a portion of the recorded signal 34 on the magnetic tape 12 closest to the conductor 16. The distance away from the conductor that the signal is erased is dependent upon the strength of the magnetic field around the conductor. The greater the peak value of the current flowing through the conductor 16 the greater the magnetic field produced. For an infinitely long straight conductor, the magnetic field strength, H, at any point away from the conductor is dependent solely upon the peak value of the current and the radial distance away from the conductor to the point. $H = I/2\pi r$ with $r$ being the distance from the conductor 16.

The lightning current detector provides a measurement of the maximum peak current of the lightning flash. It does not have the capability of distinguishing between the various strokes of the flash, the number of strokes, or the corresponding rise time or duration of the individual strokes in the lightning flash. Since the initial stroke of the flash usually generates the highest peak current, subsequent strokes should not affect any more of the recorded signal still left on the tape 12 since the corresponding magnetic fields are of a lesser intensity than the magnetic field from the initial stroke. The overlapping of successively smaller magnetic fields on the tape will reinforce that portion of the tape that was already erased from the magnetic field produced by the first stroke.

By analyzing the length of the pre-recorded signal 34 that has been erased by the magnetic field and comparing this distance with known test data utilizing known currents, the intensity of the lightning stroke and the current flowing through the guide wire 16 can be determined.

Many suitable devices can be utilized for analyzing the disturbed pre-recorded signal 34 on the tape 12. In one particular device, a conventional tape recorder is utilized for reading the signal off of the tape 12.

While a preferred embodiment of the invention has been described using specific terms, such description is for illustrative purposes only, and it is to be understood that changes and variations may be made without departing from the spirit or scope of the following claims.

What is claimed is:

1. An apparatus for measuring the intensity of a current produced in an elongated electrical conductive member by a lightning strike for determining the intensity of said lightning strike, said apparatus comprising:
   (a) an elongated strip of magnetic material,
   (b) means for holding said elongated strip of magnetic material perpendicular to said elongated electrical conductive member,
   (c) a predetermined electrical signal recorded along the length of said elongated strip of magnetic material,
   (d) one end of said magnetic material being positioned closely adjacent said electrical conductive member with the magnetic material extending perpendicularly outward from said electrically conductive member a greater distance than the distance of a magnetic field that is produced by current induced in said conductive member caused by an anticipated lightning strike,
      whereby by analyzing the distance that said recorded signal is disturbed from said one end of said magnetic material by the magnetic field, the intensity of said lightning strike can be determined.

2. The apparatus as set forth in claim 1 further comprising:
   (a) an elongated tubular housing, carried perpendicular to said electrical conductive member,
   (b) said elongated strip of magnetic material being carried in said tubular housing.

3. The apparatus as set forth in claim 2 further comprising:
   (a) a non-conductive elongated member carried in said housing,
   (b) said magnetic material extending along the length of said non-conductive member.

4. The apparatus as set forth in claim 4 wherein:
   (a) said magnetic material is in the form of an elongated endless loop,
   (b) said loop of magnetic material extending around said non-conductive elongated member along a longitudinal axis.

5. The apparatus as set forth in claim 2 further comprising:
   (a) a non-conductive brace,
   (b) means for attaching said non-conductive brace to said electrical conductive member, and
   (c) means for attaching said tubular housing to said non-conductive brace perpendicular to said electrically conductive member.

6. The apparatus as set forth in claim 2 further comprising:
   (a) removable caps carried on the ends of said tubular housing for sealing said housing and providing access to said elongated strip of magnetic material.

7. An apparatus for measuring the intensity of a current produced in an elongated electrically conductive member by a lightning strike, comprising:
   (a) an elongated, non-conductive member,
   (b) an elongated, magnetic strip extending on opposite sides of said elongated, non-conductive member,
   (c) an elongated tubular housing enclosing said non-conductive member with said elongated strip of magnetic material positioned thereon,
   (d) means for mounting said tubular housing perpendicular to said electrically conductive member, (e) a predetermined electrical signal recorded along the length of said elongated strip of magnetic material, (f) said elongated strip of magnetic material extending outwardly from adjacent said electrical conductive member a distance greater than the distance of a magnetic field that is produced by current induced in said conductive member caused by an anticipated lightning strike, whereby by analyzing the distance that said recorded signal is disturbed from said end of said magnetic strip adjacent said electrically conductive member by the magnetic field, the intensity of said lightning strike can be determined.

* * * * *

UNITED STATES PATENT OFFICE
CERTIFICATE OF CORRECTION

PATENT NO. : 4,112,357
DATED : September 5, 1978
INVENTOR(S) : Stephen F. Livermore It is certified that error appears in the above-identified patent and that said Letters Patent are hereby corrected as shown below:

Introductory Page - "[54] LIGHTING CURRENT DETECTOR" should read --[54] LIGHTNING CURRENT DETECTOR--

Column 1, line 2
"LIGHTING CURRENT DETECTOR" should read
--LIGHTNING CURRENT DETECTOR--

Signed and Sealed this

Eighth Day of May 1979

[SEAL]

Attest:

RUTH C. MASON
Attesting Officer

DONALD W. BANNER
Commissioner of Patents and Trademarks